United States Patent [19]

Morimoto

[11] 4,233,613

[45] Nov. 11, 1980

[54] COMPOUND SEMICONDUCTOR WAFER

[75] Inventor: Kiyoshi Morimoto, Mobara, Japan

[73] Assignee: Futaba Denshi Kogyo K.K., Chiba, Japan

[21] Appl. No.: 938,977

[22] Filed: Aug. 31, 1978

[30] Foreign Application Priority Data

Sep. 6, 1977 [JP] Japan ................ 52-106232

[51] Int. Cl.$^2$ .................... H01L 33/00
[52] U.S. Cl. .................... 357/16; 357/17
[58] Field of Search ............ 357/16, 17, 18

[56] References Cited

U.S. PATENT DOCUMENTS 4,115,164  9/1978  Jäger ................ 148/175
4,120,706  10/1978  Mason ............... 148/175

*Primary Examiner*—Martin H. Edlow
*Attorney, Agent, or Firm*—Oblon, Fisher, Spivak, McClelland & Maier

[57] ABSTRACT

A compound semiconductor wafer having a substrate of a IV-group element semiconductor of a predetermined conductivity type, an epitaxial layer formed by epitaxially growing on the substrate a compound semiconductor having the same conductivity type as the substrate by an ion beam deposition process or a cluster ion beam deposition process, and a compound semiconductor layer of a conductivity type opposite to that of the epitaxial layer and formed on the epitaxial layer so as to form a PN junction with the epitaxial layer.

12 Claims, 5 Drawing Figures

COMPOUND SEMICONDUCTOR WAFER

BACKGROUND OF THE INVENTION

1. Field of the Invention

The present invention relates to compound semiconductor wafers produced by forming epitaxial layers in the ion beam deposition process or the cluster ion beam deposition process, which are low in cost and controlled in shape and can be made large in size and also can be applied to light-emitting diodes, solar cells, photo detectors, etc.

2. Description of the Prior Art

In the case of compound semiconductors, the band gap thereof can be freely controlled by changing the kinds of proportions of the component elements thereof. Therefore, if the compound semiconductors are used for forming light-emitting diodes, the resulting diodes can emit light at any wavelength in the range from red light to blue light. Besides, some kinds of the compound semiconductors are very high in electron mobility and therefore very useful as ultrahigh frequency devices. In addition, the compound semiconductors have many interesting characteristics as dielectrics, magnetic substances, etc., and therefore are attracting attention from various fields as promising electronic materials.

The wafers of the above-mentioned compound semiconductors are conventionally produced by the melt growth method, solution growth method, etc. Besides, in the case of a compound semiconductor, as GaP, having a high dissociation pressure at the melting point, the so-called LEC (Liquid Encapsulated Czochralski method) recently developed is used, in which pressure is applied to the liquid from above in order to prevent the escape of V-group elements.

However, when GaP wafers are to be produced by the above-mentioned LEC method, it is necessary to heat polycrystalline GaP to its melting point and also to confine the melt in an atmosphere having a high pressure higher than the dissociation pressure of the melt at the melting point thereof in order to prevent evaporation of volatile elements, as phosphorus. In this case, operations must be performed at high temperatures and pressures. As a result, a complicated production equipment and a number of complicated processes become necessary. Accordingly, the wafers thus produced are expensive. In addition, these wafers have many problems from the viewpoint of crystallinity. When actual devices, as GaP light-emitting diodes, are to be produced, it is necessary to additionally form epitaxial growth layers on the above-mentioned wafers by the liquid or vapor growth method. Consequently, the devices thus produced are very high in cost.

Besides, compound semiconductor wafers produced by the liquid or vapor growth method also have problems from the viewpoint of crystallinity. In addition, the production equipment thereof is very complicated and expensive, and the production process thereof is also very complicated. As a result, the wafers thus produced become very expensive.

The above-mentioned LEC method and the solution growth method require polycrystalline compound semiconductors as the starting material for producing the wafers. In other words, the above methods have disadvantage in that they cannot produce monocrystalline compound semiconductors directly from the component elements.

In addition, the wafers produced by the above-mentioned production methods are uncontrolled or non-uniform in shape. For instance, truly circular wafers cannot be produced unlike in the case of silicon or germanium wafers produced by the pulling method, and therefore complicated handling operations are required for splitting the wafers into chips when devices are to be produced. As a result, automation of the production process cannot be easily achieved.

BRIEF SUMMARY OF THE INVENTION

The present invention is intended to eliminate the above-mentioned disadvantages of the prior art.

It is therefore an object of the present invention to provide a compound semiconductor wafer low in cost, controlled in shape, and capable of being made large in size.

It is another object of the present invention to provide a compound semiconductor wafer excellent in crystallinity and high in quality.

It is still another object of the present invention to provide a compound semiconductor wafer having substantially a stoichiometric composition.

It is a further object of the present invention to provide a compound semiconductor wafer whose epitaxially grown layers are high in adhesion with respect to one another.

According to the present invention, used as a substrate is a IV-group element semiconductor, as silicon or germanium, which is inexpensive, high in quality, and capable of being easily made large in size. Monocrystalline films of compound semiconductors are formed on this substrate by the ion beam deposition process or cluster ion beam deposition process. Thus, a compound semiconductor wafer low in cost, controlled in shape by the shape of the substrate, and capable of being made large in size can be produced.

According to the present invention, epitaxial growth is performed by the ion beam deposition process or cluster ion beam deposition process. More particularly, the atoms or clusters of the component elements of a compound semiconductor to be epitaxially grown are ionized, being given kinetic energy by an electric field to impinge on a substrate of a IV-group element semiconductor thereby producing a compound semiconductor wafer. The substrate can be kept at a low temperature, and therefore the epitaxial growth may be made at a low temperature. Thus, the present invention can eliminate various problem occurring in the LEC method or the like, such as deviation from the stoichiometric composition due to the escape of V-group elements or mixing of the substrate element into the epitaxial growth layer as an impurity. Thus, the present invention can produce a compound semiconductor wafer excellent in crystallinity.

According to the present invention, the surface of the substrate is etched and cleaned by sputtering caused by ions or cluster ions imparted with kinetic energy in the initial stage of epitaxial growth. Thus, the present invention can produce a compound semiconductor wafer which is improved in adhesion between the substrate and the epitaxial growth layer.

According to the present invention, an intermediate layer consisting mixedly of the component element of the substrate and those of the compound semiconductor is formed between the substrate and the epitaxial growth layer under the influence of the sputtering-etching effect of ions or cluster ions and also some ion implantation effect. The intermediate layer alleviates or absorbs the influence of the difference (misfit) between the lattice constants of the substrate and epitaxial growth layer and that between the thermal expansion coefficients thereof. Thus, the present invention can produce a compound semiconductor wafer which has a III-V compound semiconductor epitaxial layer grown on an inexpensive IV-group element semiconductor substrate and which is heretofore considered impossible to produce.

DESCRIPTION OF THE PREFERRED EMBODIMENTS

Now, the present invention will be hereinafter described with reference to the accompanying drawings.

Figure 1:
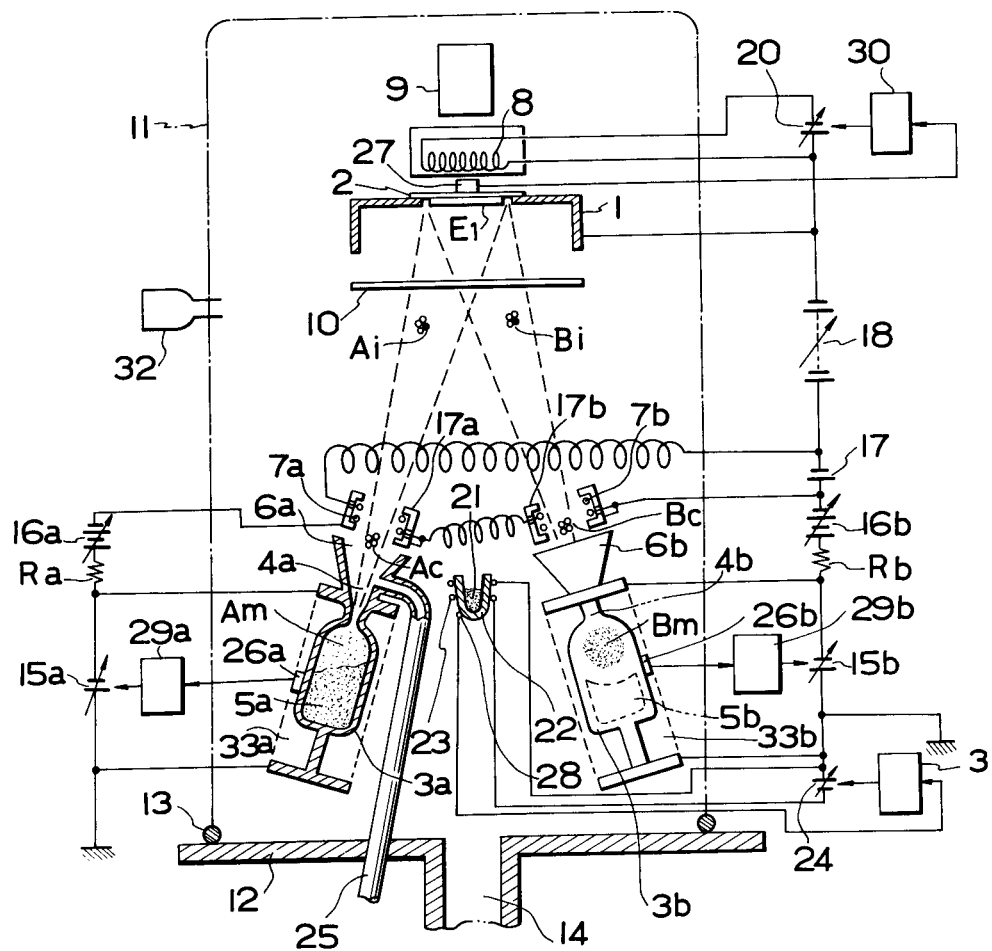
FIG. 1 is a schematic illustration of an example of the apparatus for producing compound semiconductor wafers according to the present invention.

FIG. 1 shows an apparatus for use in producing compound semiconductor wafers of the present invention utilizing the cluster ion beam deposition process. In FIG. 1, reference numeral 1 designates a substrate holder for holding a monocrystalline substrate 2 made of a group-IV element semiconductor, for instance, silicon. Reference numerals 3a and 3b designate closed type crucibles provided with small-diameter injection nozzles 4a and 4b, respectively. The crucibles 3a and 3b contain materials 5a and 5b to be vaporized, for instance, component elements of a compound semiconductor to be epitaxially grown or materials containing these component elements. Depending upon the conditions, the materials 5a and 5b contained in the respective crucibles 3a and 3b may be heated and vaporized by any one of the suitable heating methods including the direct resistance heating method in which a high current is supplied directly to the crucibles 3a and 3b, the indirect resistance heating method in which a heater provided around each of the crucibles 3a and 3b is energized for heating, the electron bombardment heating method in which the crucibles 3a and 3b are bombarded with electrons thereby to be heated, the high-frequency heating method in which the crucibles 3a and 3b or the materials 5a and 5b are heated by high-frequency induction, and others.

Reference numerals 6a and 6b designate ionization chambers adapted to ionize clusters (to be later described in detail) and provided next to each of the crucibles 3a and 3b. Reference numerals 7a and 7b designate filaments provided in the vicinity of the ionization chambers 6a and 6b and adapted to emit thermions when heated. Reference numeral 8 designates a heater provided in the vicinity of the substrate 2 and adapted to heat the substrate 2 to a predetermined temperature. Reference numeral 9 designates a film thickness sensor for measuring the thickness of a compound semiconductor film epitaxially formed on the substrate 2. Numeral 10 designates a shutter for shielding the substrate 2 from the bombardment of cluster ions (to be later described) when necessary. The shutter 10 is provided between the substrate 2 and the crucibles 3a and 3b. Numeral 11 designates a bell jar airtightly provided on a base 12 through an O-ring 13. The bell jar 11 accomodates all the parts mentioned above. The base 12 has an exhaust hole 14 through which the air is exhausted from the bell jar 11 so as to create a high vacuum therein.

Reference numerals 15a and 15b designate power supplies for supplying high currents to the respective crucibles 3a and 3b so as to heat them. Numerals 16a and 16b designate power supplies for producing electric fields for accelerating ionization electron currents between the crucible 3a and the electrode fitting 17a of the filament 7a and between the crucible 3b and the electrode fitting 17b of the filament 7b. Characters Ra and Rb designate overcurrent-inhibiting resistors. Numeral 17 designates a power supply for heating the filaments 7a and 7b. Numeral 18 designates a power supply for providing an electric field for accelerating cluster ions (to be described later) between the substrate holder 1 and the filaments 7a and 7b. If the substrate holder 1 is made of insulating material or not suitable for use as an electrode, an ion-extracting electrode may be provided between the substrate holder 1 and the ionization chambers 6a and 6b, and the ion-accelerating power supply 18 may be provided between the above-mentioned electrode and the filaments 7a and 7b.

Numeral 20 designates a power supply for energizing the heater 8 for heating the substrate 2.

Numeral 22 designates a crucible for vaporizing a dopant 21 for controlling the conductivity type of a compound semi-conductor film to be epitaxially grown on the substrate 2. The crucible 22 is provided at a proper position in the bell jar 11. Numeral 23 designates a heater for heating the crucible 22, and 24 a power supply for energizing the heater 23.

Reference numeral 25 designates a gas supply pipe for supplying, for instance, an inert gas such as argon in order to clean the surface of the substrate 1 by ion beam etching as a pre-treatment process for the substrate 1 and for supplying nitrogen or oxygen gases for forming radiative recombination centers together with the dopant 21 when wafers for GaP light-emitting diodes are to be produced. Reference numerals 26a and 26b designate temperature sensors such as thermocouples provided on the outside walls of the crucibles 3a and 3b for measuring the temperatures of these crucibles 3a and 3b.

Reference numerals 27 and 28 designate temperature sensors mounted on the substrate 2 and the crucible 22 so as to measure the temperatures thereof. The outputs of the temperature sensors 26a and 26b are fed to temperature controllers 29a and 29b. The temperature controller 29a or 29b controls the output of the power supply 15a or 15b according to the difference between the set temperature and the actual crucible temperature and thereby keeps the crucibles 3a or 3b at the set temperature. In a similar manner, the outputs of the temperature sensors 27 and 28 are fed to temperature controllers 30 and 31, whose outputs control the outputs of the power supplies 20 and 24 thereby keeping the temperatures of the substrate 2 and crucible 22 at set values. Reference numeral 32 designates a device for measuring the degree of vacuum in the bell jar 11, such as an ionization vacuum gauge.

The crucibles 3a and 3b are provided with heat-intercepting and cooling jackets 33a and 33b in order to insure infallible temperature control and to minimize the influence on other parts.

Description will be hereinafter made on the compound semiconductor wafers of the present invention produced by the above-mentioned apparatus.

First, the monocrystalline substrate 2 made of a IV-group element semiconductor such as silicon or germanium is mounted on the substrate holder 2.

Figure 2:
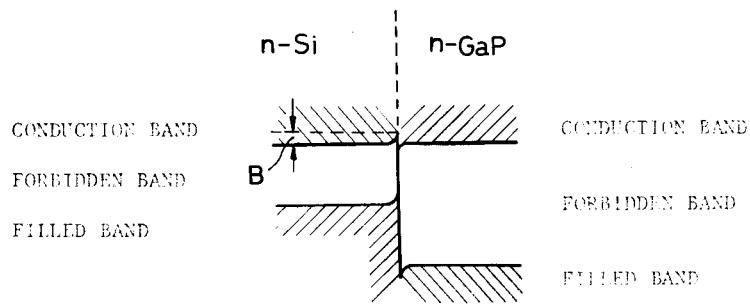
FIG. 2 is an energy level diagram for explaining compound semiconductor wafers according to the present invention.

In order to facilitate electrode mounting, in this case, the conductivity type of the substrate 2 is selected so that a barrier may not be formed between the substrate 2 and an epitaxial layer of compound semiconductor to be grown on the substrate 2. If, for instance, an epitaxial layer of GaP is to be grown on the substrate 2 made of silicon, it is necessary to use n-type silicon for the substrate 2. In other words, if an n-type GaP layer is epitaxially grown on an n-type silicon layer, the energy levels in the vicinity of the junction will appear as shown in FIG. 2 and therefore the barrier B in the vicinity of the junction will be very small.

Materials 5a and 5b to be vaporized such as component elements of a compound semiconductor to be epitaxially grown on the substrate 2 or materials containing these component elements are placed in the crucibles 3a and 3b. For instance, when a III-V compound semiconductor is to be produced, the crucible 3a is furnished with a III-group element, e.g., gallium or indium, and the crucible 3b with a V-group element, e.g., phosphorus or arsenic. Besides, the crucible 22 is furnished with a dopant for determining the conductivity type of a compound semiconductor to be epitaxially grown on the substrate 2. In this case, if the substrate 2 is of N-type, the semiconductor to be epitaxially grown on this N-type substrate 2 will be also of N-type. Therefore, the dopant put in the crucible 22 is, for instance, sulphur or selenium which acts as donors in the III-V compound semiconductor. The bell jar 11 is evacuated by an exhaust system (not shown), and thereby the inside thereof is kept at a high vacuum having a pressure of $10^{-2}$ Torr or less, preferably $10^{-4}$ or less.

Then, a small amount of an inert gas, e.g., argon gas, is introduced into the ionization chamber 6a through the gas supply pipe 25 so that, if the inside of the bell jar 11 is at a high vacuum of about $10^{-4}$ Torr, it may have a vacuum of about 1 to $10^{-2}$ Torr. The filament 7a is heated by the action of the power supply 17 to emit thermions. At the same time, an electron current flowing from the filament 7a toward the ionization chamber 6a by the action of the power supply 16a thereby to ionize the inert gas introduced. In this case, if the amount of the inert gas fed to the ionization chamber 6a is increased, a glow discharge will occur between the filament 7a and the ionization chamber 6a thereby much improving the ionization efficiency. However, the occurrence of the above-mentioned glow discharge results in the occurrence of a large electric current flowing between the filament 7a and the ionization chamber 6a. This current, however, may be restricted by the resistor Ra. Therefore, even if the above-mentioned glow discharge occurs, no adverse effect is produced on the ionization chamber 6a and the power supply 16a.

When the shutter 10 is opened, the ionized inert gas is given kinetic energy and accelerated toward the substrate 2 by the action of the power supply 18 provided between the filament 7a and the substrate holder 1. Thus, the accelerated inert gas is made to impinge on the substrate 2 to perform ion bombardment thereby etching and cleaning the surface of the substrate 2.

Though depending upon the value of the inert-gas ionization current, the voltage of the ion-accelerating power supply 18, etc., the etching time is preferably about 10 to 30 minutes.

In the above-mentioned process which cleans the surface of the substrate 2, when there is any possibility of the substrate 2 being subjected to distortion and the like, the shutter 10 is closed and the heater 8 is energized by the power supply 20 to heat and anneal the substrate 2 at a temperature of about 500° C. to 1,000° C. thereby to remove distortion and the like.

Then, the inert gas, e.g., argon, introduced in the bell jar 11 in the above-mentioned ion beam etching process is removed through the exhaust hole 14 to make the inside of the bell jar 11 again have the original vacuum having a pressure of $10^{-2}$ Torr or less, preferably $10^{-4}$ Torr or less.

Then, the crucibles 3a and 3b are energized by the power supplies 15a and 15b thereby to heat the materials 5a and 5b in the crucibles 3a and 3b.

In this case, if the materials 5a and 5b in the crucibles 3a and 3b are, for instance, gallium and phosphorus, gallium is heated to about 1,370° C. and phosphorus is heated to about 310° C. In addition, the vapor pressure of phosphorus in the crucible 3b is made to be about 10 times that of gallium in the crucible 3a so that phorphorus particles re-vaporized from the surface of the substrate 2 may be captured.

Besides, the temperatures of the crucibles 3a and 3b are detected by the temperature sensors 26a and 26b respectively. The outputs of the temperature sensors 26a and 26b are fed to the temperature controllers 29a and 29b. The temperature controller 29a or 29b control the output of the power supply 15a or 15b according to the difference between the actual temperature and the set temperature. Thus, the crucibles 3a and 3b are kept at desired temperatures independently of each other. Consequently, the pressures of the vapors of the materials 5a and 5b are automatically controlled so that they are kept at desired values.

The vapors Am and Bm of the materials 5a and 5b produced in the crucibles 3a and 3b are jetted through the injection nozzles 4a and 4b into the ionization chambers 6a and 6b kept at high vacuums having pressures 1/100 or less of those of the vapors Am and Bm. When jetted, the vapors Am and Bm are subjected to supercooling phenomenon caused by the adiabatic expansion thereof, and the atoms thereof are loosely bonded to one another by van der Waals forces, being formed into a number of atom groups or clusters Ac and Bc each normally consisting of about 100 to 2,000 atoms. In this case, it does not necessarily follow that all the vapors Am and Bm jetted are formed into clusters Ac and Bc. Strictly speaking, they contain molecular or atomic particles as well. However, this fact has no influence on the operation and effects of the present invention.

The clusters Ac and Bc thus formed advance in the form of beams toward the substrate 2 through the ionization chambers 6a and 6b, while having injection energies and directivities given when jetted. Meanwhile, the filaments 7a and 7b are heated by the action of the power supply 17 to emit thermions. At the same time, by the action of the power supplies 16a and 16b, these thermions are formed into electron currents flowing from the filaments 7a and 7b toward the ionization chambers 6a and 6b where clusters Ac and Bc are passing. Thus, the clusters Ac and Bc are bombarded with these electron currents. In this case, when at least one of the atoms of each cluster is ionized, the cluster is changed into a so-called cluster ion. Thus, the clusters Ac and Bc are formed into cluster ions Ai and Bi.

If, in this case, the shutter 10 is opened, the cluster ions Ai and Bi are accelerated by an electric field formed by the power supply 18, being imparted with large kinetic energy and moving toward the substrate 2. Meanwhile, the neutral clusters Ac and Bc not ionized in the ionization chambers 6a and 6b also move toward the substrate 2 by the action of the injection energy given thereto when jetted. Thus, the cluster ions Ai and Bi and the neutral clusters Ac and Bc impinge on the substrate 2. In this case, the substrate 2 is heated by the heater 8 so that it may be kept at a temperature necessary for the epitaxial growth of the compound semiconductor thereon, for instance, at about 300° C. to 600° C.

When the cluster ions Ai and Bi and the clusters Ac and Bc impinge on the surface of the substrate 2, the kinetic energy thereof is partially converted into sputtering energy and thereby the surface of the substrated 2 is cleaned. In addition, part of the above-mentioned kinetic energy is converted into heat energy to locally heat the substrate 2 thereby effectively maintaining the substrate 2 at a temperature required for the epitaxial growth.

When the cluster ions Ai and Bi and the clusters Ac and Bc impinge on the surface of the substrate 2, they are decomposed into atomic particles, which form a semiconductor film while rolling over the surface of the substrate 2. This phenomenon is usually called the surface migration effect. More particularly, the above-mentioned component elements decomposed into atomic particles are chemically bonded to one another by the surface migration effect. As a result, a stoichiometric epitaxial layer $E_1$ high in quality, excellent in crystallinity and strong in bonding power with respect to the substrate 2 and between the atoms of itself is formed in the condition where the temperature of the substrate 2 is as low as 300° C. to 600° C.

In the above-mentioned process for obtaining the epitaxial layer $E_1$, the heater 23 is energized by the power supply 24 to heat the dopant 21 (for instance, for acting as donors in the compound semiconductor) in the crucible 22 at a desired temperature set in the temperature controller 31 thereby to vaporize it under a predetermined vapor pressure. The vapor of the dopant 21 thus formed moves toward the substrate 2, reaching the surface of the substrate 2 together with the cluster ions Ai and Bi and the neutral clusters Ac and Bc. Thus, the vapor of the dopant 21 diffuses in the epitaxial layer $E_1$. As a result, the epitaxial layer $E_1$ is imparted with a controlled impurity concentration, being made to be of N-type.

When a wafer for light-emitting diodes is to be produced, gases such as nitrogen and oxygen for forming radiative recombination centers in cooperation with the above-mentioned dopant 21 are introduced into the bell jar 11 through the gas supply pipe 25. Thus, radiative recombination centers capable of emitting red or green light can be formed in the epitaxial layer $E_1$.

Figure 3:
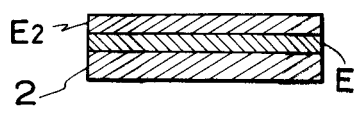
FIGS. 3 and 4 are sectional views of compound semiconductor wafers according to different preferred embodiments of the present invention respectively.

As shown in FIG. 3, first formed in this manner on the substrate 2 of a IV-group element semiconductor, as germanium or silicon, is the first epitaxial layer $E_1$ having predetermined characteristics controlled according to the shape of the substrate 2 and the crystal axis of the substance thereof.

Figure 4:
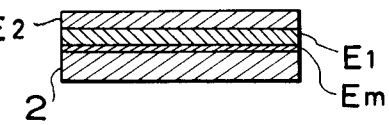

In this case, if the voltage of the power supply 18 for accelerating the cluster ions Ai and Bi toward the substrate 2 is properly chosen, the above-mentioned sputtering energy can be increased. As a result, the substrate 2 made of a IV-group element is sputtered, and the particles of the IV-group element thus emitted are again deposited on the substrate 2 together with the cluster ions Ai and Bi and the clusters Ac and Bc arriving at the substrate 2. Meanwhile, the cluster ions Ai and Bi are imparted with implantation energy. Owing to the above-mentioned sputtering and ion implantation effects, a so-called intermediate layer Em containing both the component elements of the substrate 2 and those of the compound semiconductor is formed between the substrate 2 and the epitaxial layer $E_1$ as shown in FIG. 4.

Figure 5:
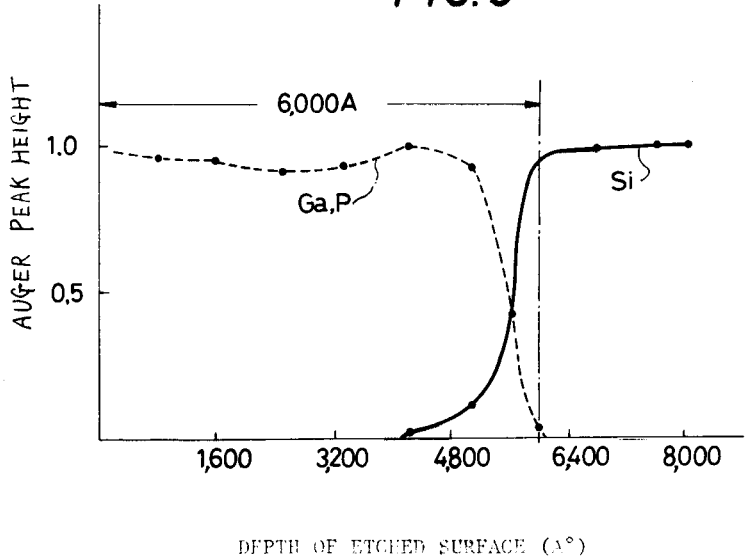
FIG. 5 is a diagram showing the results of Auger electron spectrometry of the intermediate layer and its vicinity.

As mentioned above, the thickness and structure of the intermediate layer Em are controlled by the accelerating voltage given by the ion-accelerating power supply 18, the substrate temperature, etc. FIG. 5 shows an example of the results of experiments conducted by the inventor in connection with this manner.

The diagram shown in FIG. 5 was obtained in the following manner:

The substrate 2 made of monocrystalline silicon was heated at 600° C. The accelerating voltage is set at 6 KV by the ion-accelerating power supply 18. Thus, an epitaxial layer $E_1$ of GaP 6,000 Å thick was grown on the silicon substrate 2. Then, the epitaxial layer $E_1$ was etched several times, and its elementary composition at each etched surface was analyzed by Auger electron spectroscopy.

In FIG. 5, chosen as the abscissa is the depth of the etched surface measured with the position of the original surface of the epitaxial layer $E_1$ as the reference plane, and chosen as the ordinate is the Auger peak height on the etched surface. Thus, the change of the Auger peak height of silicon is plotted by a solid line, and that of gallium and phosphorus by a broken line.

FIG. 5 reveals that a so-called intermediate layer Em mixedly containing silicon, gallium and phosphorus is formed in the vicinity of the surface (whose position corresponds to an etching depth of 6,000 Å) of the silicon substrate 2. The intermediate layer Em alleviates or absorbs the influences of the difference (or misfit) between the lattice constant of the component element of the substrate 2 and that of the compound semiconductor of the epitaxial layer $E_1$ and also the influence of the difference between the thermal expansion coefficients thereof. Thus, the presence of the intermediate layer Em makes it possible to smoothly grow the epitaxial layer $E_1$ on the substrate 2 and also to remarkably improve adhesion between the substrate 2 and the epitaxial layer $E_1$.

After completion of the above-mentioned process, placed in the crucible 22 as the dopant 21 is an element, as zinc, which acts as acceptor in the compound semiconductor to give it P-type conductivity. Then, a process similar to the above-mentioned process is performed to form on the epitaxial layer $E_1$ another epitaxial layer $E_2$ opposite in conductivity type to the epitaxial layer $E_1$. Besides, the epitaxial layer $E_2$ may be formed by diffusing only the dopant 21, or acceptor impurity, in the epitaxial layer $E_1$ to form a diffusion layer having the opposite conductivity type and ranging from the surface of the epitaxial layer $E_1$ to a predetermined depth. In other words, the epitaxial layer $E_2$ thus formed is a semiconductor layer which forms a PN junction with the epitaxial layer $E_1$ and is opposite in conductivity type thereto.

In this manner, a compound semiconductor wafer having a PN junction is formed on the substrate 2 of a IV-group element semiconductor as shown in FIG. 3 or 4.

In the above-mentioned preferred embodiments, the growth of the epitaxial layer $E_1$ is achieved by the cluster ion beam deposition process in which the closed type crucibles 3a and 3b are used. In the production apparatus shown in FIG. 1, however, open-type crucibles 3a and 3b may be used to grow the epitaxial layer $E_1$ by the ion beam deposition process. The compound semiconductor wafer thus produced has the same characteristics as the above-mentioned.

The following are the possible combinations of the material or substance of the substrate 2 and the compound semiconductor to be grown on the substrate:

When the substrate 2 is made of germanium, the compound semiconductor to be grown thereon may be GaAs, GaAsP, GaP, AlAs, or ZnSe, for instance. When the substrate 2 is made of silicon, the compound semiconductor may be GaAsP or GaP, for instance.

As mentioned above, the compound semiconductor wafer of the present invention is composed of a substrate made of a IV-group element semiconductor, as silicon or germanium, which can easily make the substrate large in size and truly circular in shape, and compound semiconductor layers epitaxially grown on the substrate by the ion beam deposition process or the cluster ion beam deposition process.

Accordingly, the compound semiconductor wafers of the present invention have the following advantages over those epitaxially grown by the conventional methods including liquid encapsulated Czochrakski method (LEC), solution growth (SG), liquid growth, vapor growth, etc.:

(1) The epitaxial growth of compound semiconductors can be effectively performed, because the kinetic energy of ions or cluster ions of the component elements of compound semiconductor is partially converted into heat energy, sputtering energy or implantation energy when the above-mentioned ions or clusters impinge on the substrate and, in addition, produces the surface migration effect in the case of the cluster ion deposition process. Therefore, the so-called epitaxial temperature, or the temperature of the substrate required for the epitaxial growth of semiconductors thereon, can be much lowered. The low epitaxial temperature can eliminate the escape of the particles of a component element higher in vapor pressure among the component elements of the semiconductors forming the epitaxial layer and the possibility the component elements of the substrate being diffused into the epitaxial layer thereby acting as harmful impurities. In addition, the low epitaxial temperature is helpful to produce a compound semiconductor wafer high in crystallinity and small in deviation from the stoichiometric composition.

The component elements of the compound semiconductor arrive directly at the substrate in the form of ions or cluster ions through a high vacuum region, and therefore there is no possibility of the crystal quality being deteriorated due to the influence of carrier gases and, as a result, wafers extremely high in quality can be obtained.

(2) The surface of the substrate is cleaned by the sputtering energy of ions or cluster ions thereby improving the adhesion of the epitaxial layer with respect to the substrate. In addition, an intermediate layer is formed between the substrate and the epitaxial layer under the influence of the sputtering energy and implantation energy. Consequently, the influence of the difference between the lattice constants of the substrate and the epitaxial layer and between the thermal expansion coefficients thereof is alleviated or absorbed thereby improving the adhesion therebetween. Thus, a stable compound semiconductor wafer having no possibility of being subjected to peeling-off or cracking can be obtained.

(3) The substrate is made of a IV-group element semiconductor which can be easily made large in size and truly circular in shape. The compound semiconductor is epitaxially grown on this substrate while being controlled by the shape of the substrate and the crystal axis of the substance thereof. Therefore, the compound wafers thus produced are very easy to handle when a device is to be produced therewith, large in size, controlled in shape, as truly circular, and excellent in crystallinity.

(4) The substrate is made of a IV-group element semiconductor inexpensive and easily available. In addition, the compound semiconductor is epitaxially grown on this substrate with the component elements thereof as the starting material. Therefore, it is not necessary to previously prepare polycrystalline compound semiconductors as the starting material, and the production apparatus can be made very inexpensive. As a result, the compound semiconductor wafers thus produced are very low in production cost.

(5) When, for instance, N-type GaP is epitaxially grown on N-type silicon, the barrier between the substrate and the epitaxial layer is very low as shown in FIG. 2. Therefore, it becomes possible to derive energy level benefits directly from the substrate. As a result, it is very easy to mount electrodes on the compound semiconductor thus produced.

(6) Generally, IV-group element semiconductors are impervious to visible rays of light. Therefore, when the compound semiconductor wafer of the present invention is applied, for instance, to a monolithic display element, there scarcely appears a blur in light even when the epitaxial layer is transparent as in the case of GaP. Thus, the compound semiconductor wafers of the present invention may be favorably used as display elements.

Obviously many modifications and variations of the present invention are possible in the light of the above teachings. It is therefore to be understood that within the scope of the appended claims the invention may be practiced otherwise than as specifically described.

What is claimed as new and desired to be secured by Letters Patent of the United States is:

1. A compound semiconductor wafer comprising a substrate of a IV-group element semiconductor having a predetermined conductivity type, an epitaxial layer formed by epitaxially growing on said substrate a compound semiconductor having the same conductivity type as the substrate by an ion beam deposition process or a cluster ion beam process, said compound semiconductor being selected from a group of compound semiconductors comprising both binary and ternary III-V semiconductor compounds; and a compound semiconductor layer having a conductivity type opposite to that of said epitaxial layer and formed on said epitaxial layer so as to form a PN junction with said epitaxial layer.

2. The compound semiconductor wafer as set forth in claim 1, wherein said compound semiconductor layer having a conductivity type opposite to that of said epitaxial layer is another epitaxial layer formed by epitaxially growing on said epitaxial layer a compound semiconductor having a conductivity opposite to that of said epitaxial layer by an ion beam deposition process or a cluster ion beam deposition process.

3. The compound semiconductor wafer as set forth in claim 1, wherein said compound semiconductor layer having a conductivity type opposite to that of said epitaxial layer is a diffusion layer formed by diffusing into said epitaxial layer from the surface thereof impurities opposite in conductivity type to said epitaxial layer so as to form a PN junction.

4. A compound semiconductor wafer comprising a substrate of a IV-group element semiconductor having a predetermined conductivity type, an intermediate layer formed by making impinge on said substrate a compound semiconductor having the same conductivity type as said substrate by an ion beam deposition process or a cluster ion beam deposition process so that it contains the component element of said substrate and the component elements of said compound semiconductor mixedly, said intermediate layer being a ternary semiconductor compound mixedly containing silicon, gallium and phosphorus; an epitaxial layer of said compound semiconductor having the same conductivity type as said substrate, said epitaxial layer being formed by epitaxially growing said compound semiconductor on said intermediate layer by continuing said ion beam deposition process or said cluster ion beam deposition process, and a compound semiconductor layer having a conductivity type opposite to that of said epitaxial layer and formed on said epitaxial layer so as to form a PN junction therewith.

5. The compound semiconductor wafer as set forth in claim 4, wherein said compound semiconductor layer having a conductivity type opposite to that of said epitaxial layer is another epitaxial layer formed by epitaxially growing on said epitaxial layer a compound semiconductor having a conductivity type opposite to that of said epitaxial layer by an ion beam deposition process or a cluster ion beam deposition process.

6. The compound semiconductor wafer as set forth in claim 4, wherein said compound semiconductor layer having a conductivity type opposite to that of said epitaxial layer is a diffusion layer formed by diffusing into said epitaxial layer from the surface thereof impurities opposite in conductivity type to said epitaxial layer so as to form a PN junction.

7. The compound semiconductor wafer as set forth in claim 1 wherein said substrate is a silicon substrate and said compound semiconductor having the same conductivity type as said substrate is a binary compound of GaP.

8. A compound semiconductor wafer comprising a substrate of a IV-group element semiconductor having a predetermined conductivity type, an intermediate layer formed by making impinge on said substrate a compound semiconductor having the same conductivity type as said substrate by an ion beam deposition process or a cluster ion beam deposition process so that it contains the component element of said substrate and the component elements of said compound semiconductor mixedly, an epitaxial layer of said compound semiconductor having the same conductivity type as said substrate, said epitaxial layer being formed by epitaxially growing said compound semiconductor on said intermediate layer by continuing said ion beam deposition process or said cluster ion beam deposition process, said compound semiconductor being selected from a group including both binary and ternary III-V semiconductor compounds; and a compound semiconductor layer having a conductivity type opposite to that of said epitaxial layer and formed on said epitaxial layer so as to form a PN junction therewith.

9. The compound semiconductor wafer as set forth in claim 1 wherein said group of compound semiconductors includes binary II-VI semiconductor compounds.

10. The compound semiconductor wafer as set forth in claim 9 wherein said compound semiconductor is ZnSe.

11. The compound semiconductor wafer as set forth in claim 8 wherein said group of compound semiconductors includes binary II-VI semiconductor compounds.

12. The compound semiconductor wafer as set forth in claim 11 wherein said compound semiconductor is ZnSe.

* * * * *